United States Patent [19]

Driller et al.

[11] Patent Number: 4,614,386
[45] Date of Patent: Sep. 30, 1986

[54] ADAPTOR FOR CHANGING THE PITCH OF A CONTACT ARRAY USED WITH A PRINTED CIRCUIT BOARD TESTING APPARATUS

[75] Inventors: Hubert Driller; Paul Mang, both of Schmitten, Fed. Rep. of Germany

[73] Assignee: Mania Elektronik Automatisation Entwicklung und Gerätebau GmbH, Schmitten, Fed. Rep. of Germany

[21] Appl. No.: 669,309

[22] Filed: Nov. 7, 1984

[30] Foreign Application Priority Data

Nov. 7, 1983 [DE] Fed. Rep. of Germany ....... 3340179

[51] Int. Cl.⁴ .................... G01R 31/02; H01R 9/09
[52] U.S. Cl. ..................... 339/17 M; 324/158 F
[58] Field of Search .......... 339/17 R, 17 M, 17 LM, 339/17 CF, 17 N; 324/72.5, 73 PC, 158 P, 158 F

[56] References Cited

U.S. PATENT DOCUMENTS

| | | | |
|---|---|---|---|
| 3,963,986 | 6/1976 | Morton et al. | 324/158 F |
| 4,250,536 | 2/1981 | Barringer et al. | 361/413 |
| 4,340,858 | 7/1982 | Malloy | 324/158 P |

FOREIGN PATENT DOCUMENTS

| | | |
|---|---|---|
| 2525166 | 1/1976 | Fed. Rep. of Germany . |
| 2933862 | 3/1981 | Fed. Rep. of Germany . |

OTHER PUBLICATIONS

IBM Bulletin, Johnson, vol. 21, No. 6, p. 2320, 11-1978.
IBM Technical Disclosure Bulletin, vol. 17, No. 3, Aug. 1974, "Space Transformer for Use in an Electronic Test System", R. Bove et al., pp. 930-931.
IBM Technical Disclosure Bulletin, vol. 16, No. 8, Jan. 1974, "AC Space Transformer for Multipin Sytems", A. Perlmann et al, pp. 2724, 2726.

Primary Examiner—Neil Abrams
Attorney, Agent, or Firm—Wenderoth, Lind & Ponack

[57] ABSTRACT

An apparatus for changing the contact pitch of a contact array of a first density to a contact array of a second density includes first and second pluralities of cards, with the cards having a first row of contacts disposed along one edge thereof having a mutual spacing therebetween equal to the pitch of one of the arrays and a second row of contacts along another edge having a mutual spacing equal to the pitch of the other one of the arrays. The cards in their respective pluralities are arranged parallel with one another with the two pluralities of cards facing each other and disposed at a right angle to each other. The first rows of contacts of the first plurality of cards provide a contact array having the first density while the second rows of contacts of the second plurality of cards define a contact array of the second density.

19 Claims, 12 Drawing Figures

ADAPTOR FOR CHANGING THE PITCH OF A CONTACT ARRAY USED WITH A PRINTED CIRCUIT BOARD TESTING APPARATUS

BACKGROUND OF THE INVENTION

The present invention relates to an adaptor assembly for changing the pitch of a contact array of the type employed in a printed circuit board testing apparatus and in other applications.

Automatic printed circuit board testing apparatus are well known in the prior art and usually include a grid or array of contacts which are to be connected with a printed circuit board to be tested. Often, the printed circuit board is interfaced to the grid of contacts using a customizable fixture of the type described in U.S. patent application Ser. No. 179,844 filed Aug. 20, 1980, now abandoned and replaced by U.S. patent application Ser. No. 489,133, filed Apr. 29, 1983, and which corresponds to German laid open Application No. 2,933,862. The grid or array found in a conventional printed circuit board testing apparatus have a pitch of 2.54 mm (0.10 inch) and may have a contact grid of 256 by 256 contacts, thereby providing a total of 65,536 contacts. Typically, selected ones of the 65,536 contacts are connected to predetermined points on the printed circuit board to be tested by the customizable fixture mentioned above.

In the prior art, conventional plastic or fiberglas printed circuit boards have holes drilled therein to receive the conductors of various electronic components to be mounted on the board and with respect to such components, the closest spacing between the individual conductors thereof have typically been on the order or 2.54 mm (0.10 inch). Accordingly, it has been the practice in the prior art with respect to conventional plastic and fiberglas printed circuit boards that the contacts thereon have spacings no closer than 2.54 mm. Consistent with this closest spacing for conventional printed circuit boards, the contact grid or array found in prior art testing apparatuses have typically had a pitch on the order of 2.54 mm. Since the pitch of the contact grid of the testing apparatus has closely coincided with the tightest configuration of contact test points found on printed circuit boards, the pins used in the customizable fixture to interface the board to the grid array did not require undue bending to bring a contact point on the grid into connection with a test point on the printed circuit board.

However, if such a prior art testing apparatus is used with newer designs of printed circuit boards (such as ceramic print circuit boards), which have a much higher contact density, it can be very difficult, if not impossible, to interface the printed circuit board having a high density of contacts to a testing apparatus having a lower density of contacts.

Conventionally, with respect to ceramic printed circuit boards, the contacts thereon can have a pitch as little as 1.27 mm (0.05 inch).

Of course, one solution to this problem would be to redesign the test apparatus and the customizable fixture so that both have a contact grid with a pitch of 1.27 mm. However, this is a rather expensive solution to the problem, since the testing apparatus is expensive. Accordingly, it is an object of the present invention to provide a reducing apparatus for a printed circuit board tester so that the pitch of the contact grid may be simply and inexpensively reduced.

BRIEF DESCRIPTION OF THE INVENTION

The present invention provides an assembly for changing the pitch of a contact array from a grid having a coarse spacing to another grid having a fine spacing, and visa versa. The assembly includes first and second pluralities of printed circuit cards, each card having two opposite parallel edges, each having thereon a row of contacts, the row along one edge being of the finer spacing and the row along the other edge being of the coarser spacing. One of the pluralities of cards are disposed parallel to each other at a spacing equal to the coarser spacing. The second plurality of cards are arranged parallel to each other with a spacing equal to the finer spacing. The two pluralities of cards are arranged at right angles to each other, and the rows of contacts having a finer spacing from the first plurality of cards are brought into electrical contact with the rows of contacts of a coarser spacing on the second plurality of cards, preferably using an array of pins.

As a result, the parallel rows of first contacts from the first plurality of printed circuit cards define an array having a coarse pitch, whereas the second contacts of the second array define a contact grid having a fine pitch. The contacts in each array are electrically connected through conductors and connectors disposed on the two pluralities of printed circuit cards.

DETAILED DESCRIPTION OF A PREFERRED EMBODIMENT

Figure 1:
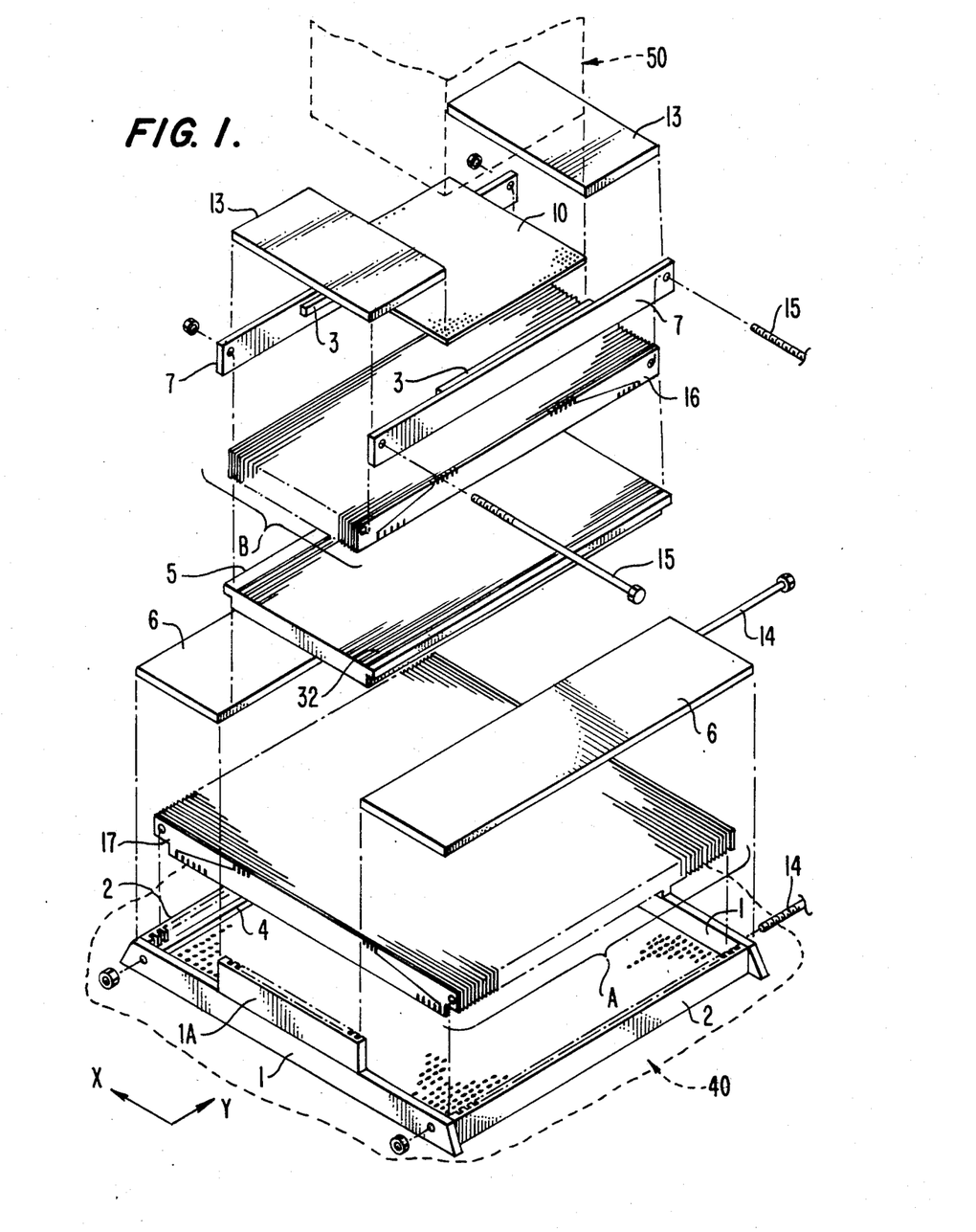
FIG. 1 is an exploded, perspective, schematic view of an adaptor for changing the pitch of a contact array employing the present invention.

FIG. 1 is an exploded, perspective, schematic view showing the internal construction of the reducing adaptor for a printed circuit board testing device according to the present invention. The testing apparatus 40 is located immediately below the depicted reducing adaptor while a customizable fixture 50, which may be of the type disclosed in the aforementioned U.S. patent application Ser. No. 179,844, is located above the reducing adaptor.

Figure 2A:
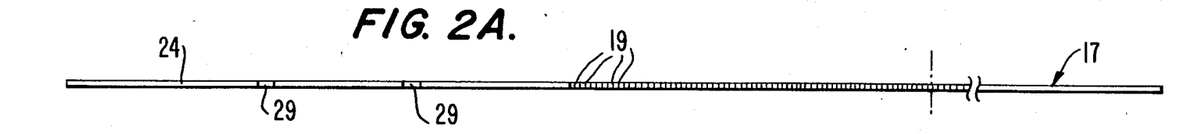
FIGS. 2A–2E are views of a card of the type employed in the adaptor of FIG. 1.
Figure 2B:
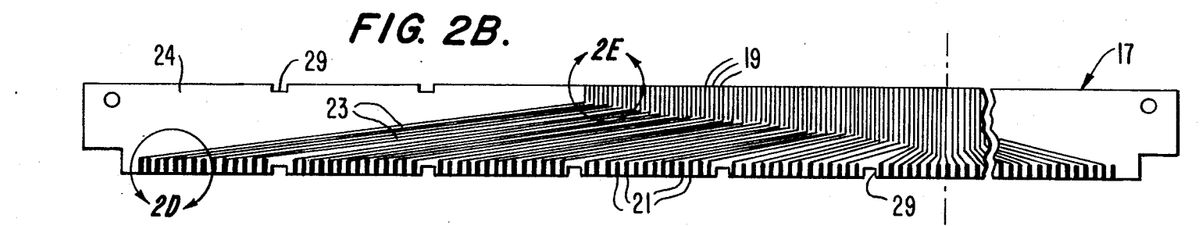
Figures 2C, 2D, 2E:
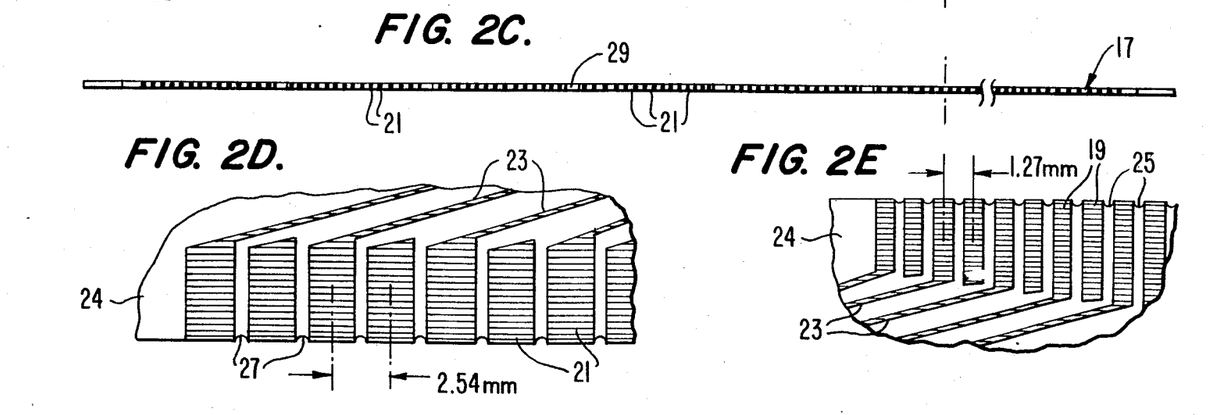

The reducing adaptor comprises first and second pluralities of parallely disposed printed circuit cards 17, 16, the first plurality of cards 17 being identified by the letter A and the second plurality of cards 16 being depicted by the letter B. The individual printed circuit cards 17 and 16 from the first and second pluralities are very similar in construction to each other and may even be identical. A typical one of the cards 17 is depicted in FIGS. 2A–2E. Referring briefly to these figures, FIG. 2B is a side view of an individual card 17 whereas FIGS. 2A and 2C are top and bottom views, respectively. FIGS. 2E and 2D are detailed side views of the top and bottom connectors 19 and 21, respectively. Cards 17 are preferably fabricated using conventional printed circuit board construction techniques and thus may preferably include a substrate 24 of a fiberglas material upon which has been prepared printed circuit patterns forming top connectors 19, bottom connectors 21 and conductors 23 connecting each top connector 19 to an associated bottom connector 21. The connectors 19 and 21 preferably are formed around the edges of the substrate 24 so as to be available for making electrical contact along the top and bottom edges of the cards as can be seen in FIGS. 2A and 2C. The conducting patterns are typically metallic and typically prepared using conventional printed circuit board photographic imaging and etching technology (i.e., the subtractive process of making printed circuit boards) or by photographic imaging and metal disposition technology (i.e., the conventional additive technology). As can be seen in FIGS. 2E and 2D, small grooves 25 and 27 are preferably cut between connectors 19 and 21 in the printed circuit board material 24 so as to cause the connectors 19 and 21 to project slightly from the surrounding material 24 to thereby improve the ohmic contact made between the two pluralities of cards 16 and 17, between cards 17 and the testing apparatus 40 and between cards 16 and the customizable fixture 50. The pitch of connectors 21 is courser than the pitch of connectors 19. Indeed, the pitch of connectors 21 is preferably on the order of 2.54 mm whereas the pitch of connectors 19 is preferably on the order of 1.27 mm.

In FIGS. 2E and 2D, only every other contact 19, 21 is shown with an associated conductor 23. The reason for this is that conductors 23 are preferably disposed on both the fronts and backs of cards 16, 17 and in the regions where conductors 23 approach their contacts 19, 21 at a sharp angle, the even contacts are provided with their conductors 23 affixed on one side of the substrate 24 while the odd contacts have their conductors affixed on the other side of the substrate 24. Toward the center of cards 16, 17, each contact 19, 21 may have an associated conductor 23 located on both sides of the substrate 24 as in this area there is plenty of room to accommodate conductors 23.

Figure 5A:
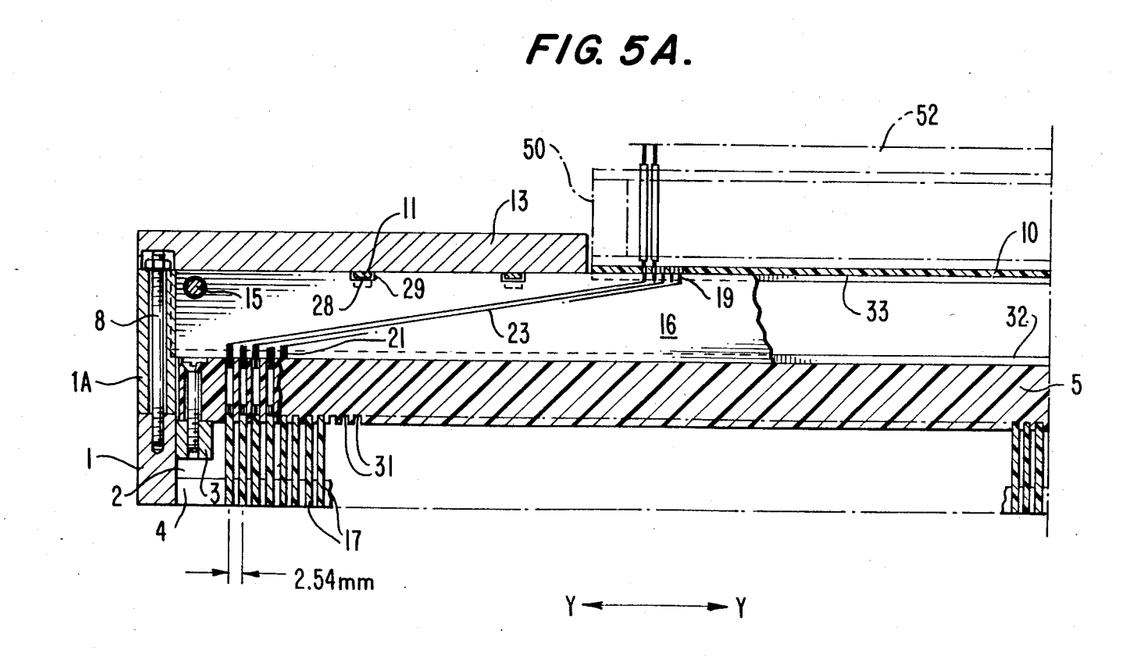
FIGS. 5A and 5B depict a sectional view through the adaptor as indicated in FIG. 4.
Figure 5B:
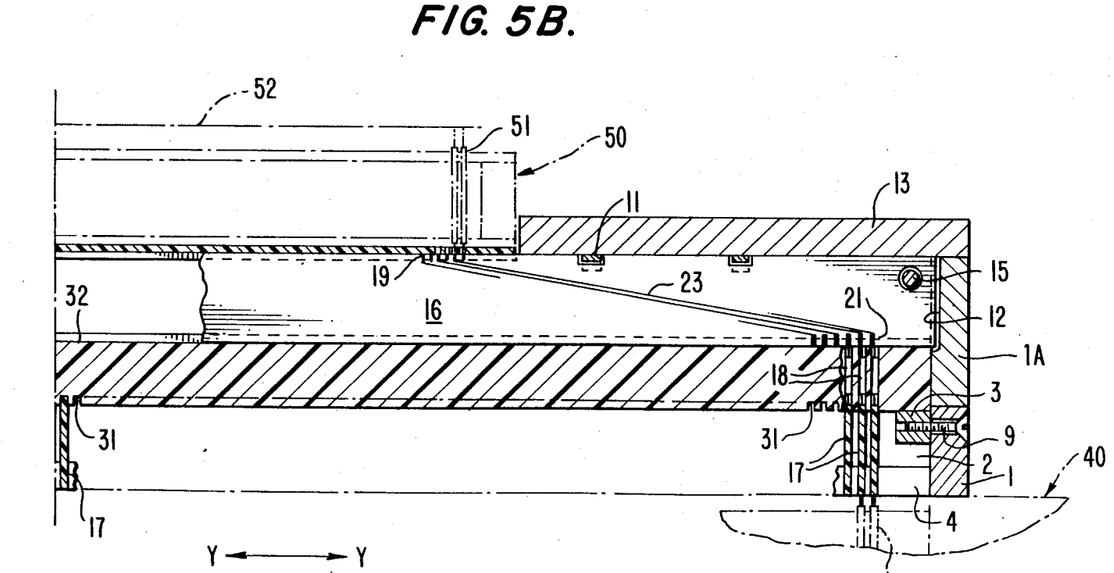
Figure 6A:
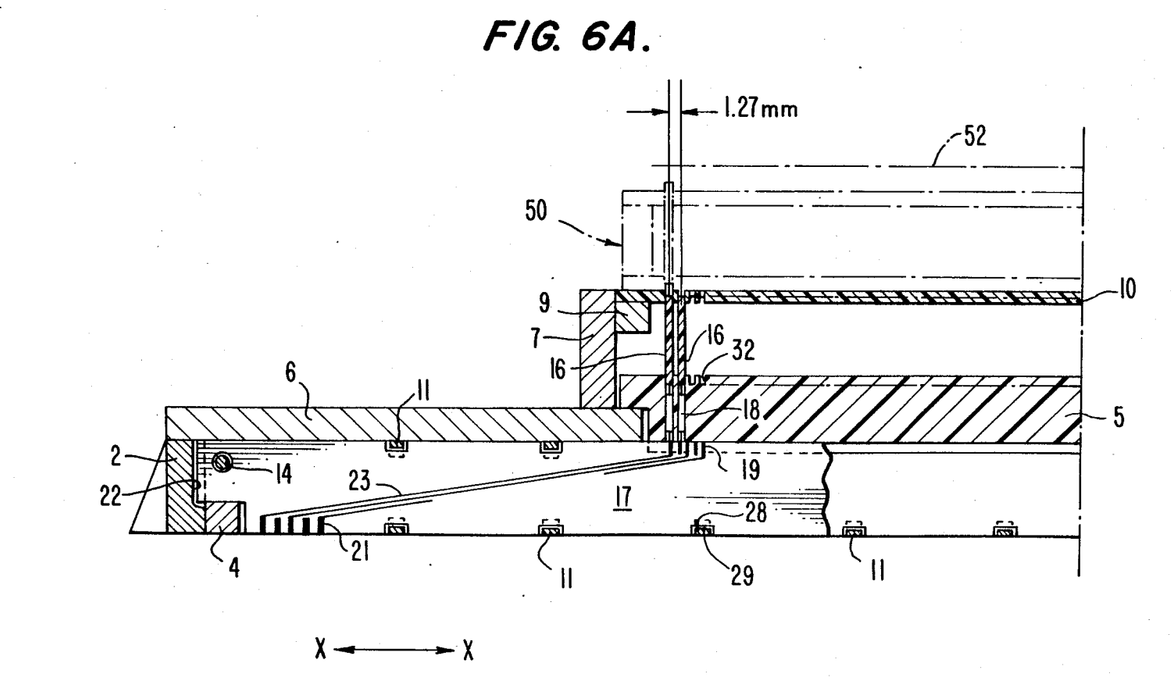
FIGS. 6A and 6B depict another sectional view through the adaptor as indicated in FIG. 4.

As is more clearly depicted in FIG. 5A, the spacing between the adjacent parallel cards 17 of the first plurality A are preferably spaced with the same coarse spacing as are connectors 21, that is with a spacing on the order of 2.54 mm. Thus, lower contacts 21 on all of the cards 17 present an array of contacts 21 having a spacing on the order of 2.54 mm to the testing apparatus 40 disposed below the reducing adaptor. As shown in FIG. 6A, the upper plurality of cards 16 are disposed parallel to each other with a spacing equal to the spacing of contacts 19, that is, preferably with a spacing on the order of 1.27 mm. Contacts 19 on the plurality of cards 16 define an array of contacts having a spacing on the order of 1.27 mm therebetween. A customizable fixture of the type taught in the aforementioned patent application having a pitch compatible with the array of contacts 19 may be utilized to interface the array of contacts 19 to desired test points on a ceramic printed circuit board to be tested.

The various arrays of contacts 19 and 21 associated with pluralities of cards A and B are intended to lie in planes. However, due to various construction tolerances, the arrays of contacts 19 and 21 may be offset somewhat from their nominal planes. In order to compensate for such offsets and to ensure that desired electrical connections are made to the test apparatus 40 and to the customizable fixture 50, telescoping pins 18 are preferably disposed in a guide plate 5 between the two pluralities of cards 16, 17 to help ensure proper ohmic contact between the lower contacts 21 of the upper array B and upper contacts 19 of the lower array A. Preferably, the pins are loosely received in openings in guide plate 5, but have collars (not shown) to keep them from falling through. The end pins 18 are urged axially away from each other by spring means located within each pin, thereby urging the ends of pins 18 into good ohmic contact with their associated contacts 19, 21 while the pins move as needed within their openings to equalize the contact force against contacts 19 and 21. Also, the test apparatus 40 preferably has pins associated therewith in order to ensure good ohmic contact with the test connections within the testing apparatus and the lower contacts 21 associated with the plurality of cards A. Likewise, the customizable adaptor 50 preferably has telescopically related pins for mating with desired contacts in the array of contacts 19 presented by the plurality of cards B.

Figure 3:
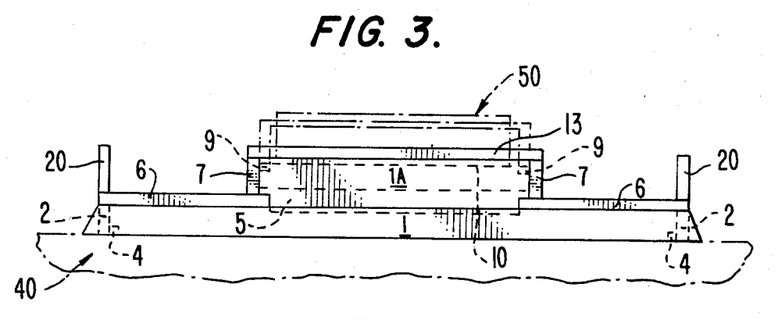
FIG. 3 is a side elevational view of the adaptor.
Figure 4:
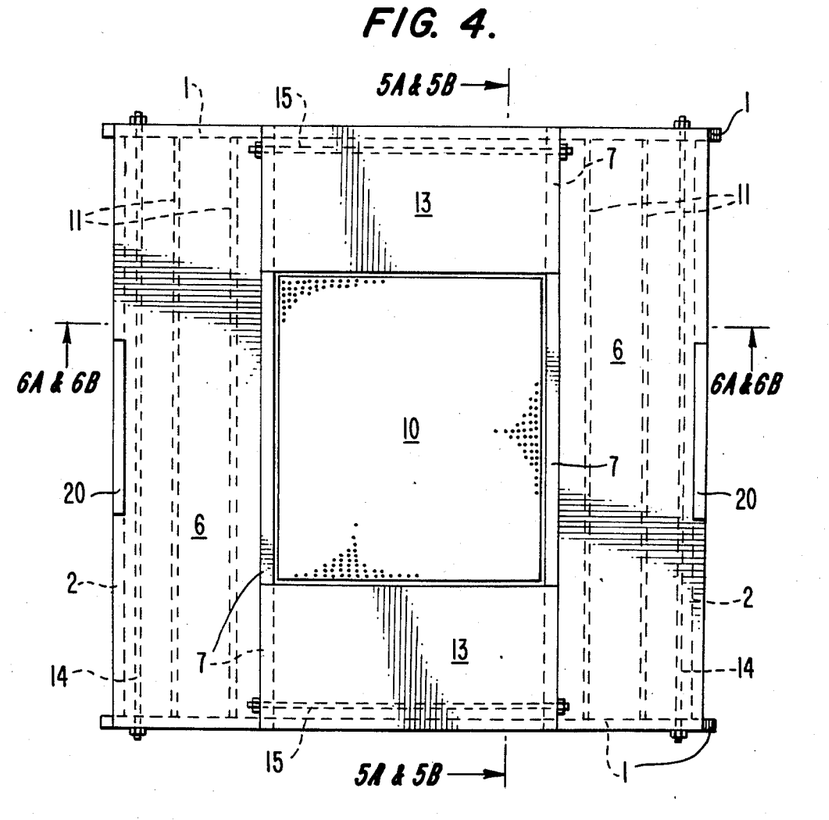
FIG. 4 is a top plan view of the adaptor.

Those skilled in the art will appreciate that the reduction from the relatively coarse 2.54 mm pitch array to the relatively fine 1.27 mm pitch array is accomplished in a two-step manner. The first reduction occurs along the X axis depicted in FIG. 1 whereas the second reduction occurs along the Y axis. FIG. 1 depicts schematically how the two sets of cards 16, 17 are disposed with respect to one another. In order to keep these cards in their proper alignment, the cards are held in a frame which will be described hereinafter. FIG. 3 is a side elevational view of the frame while FIG. 4 is a plan view thereof. FIGS. 5A, 5B, 6A and 6B are sectional views taken through the frame and the cards therein as noted by the section lines in FIG. 4.

Figure 6B:
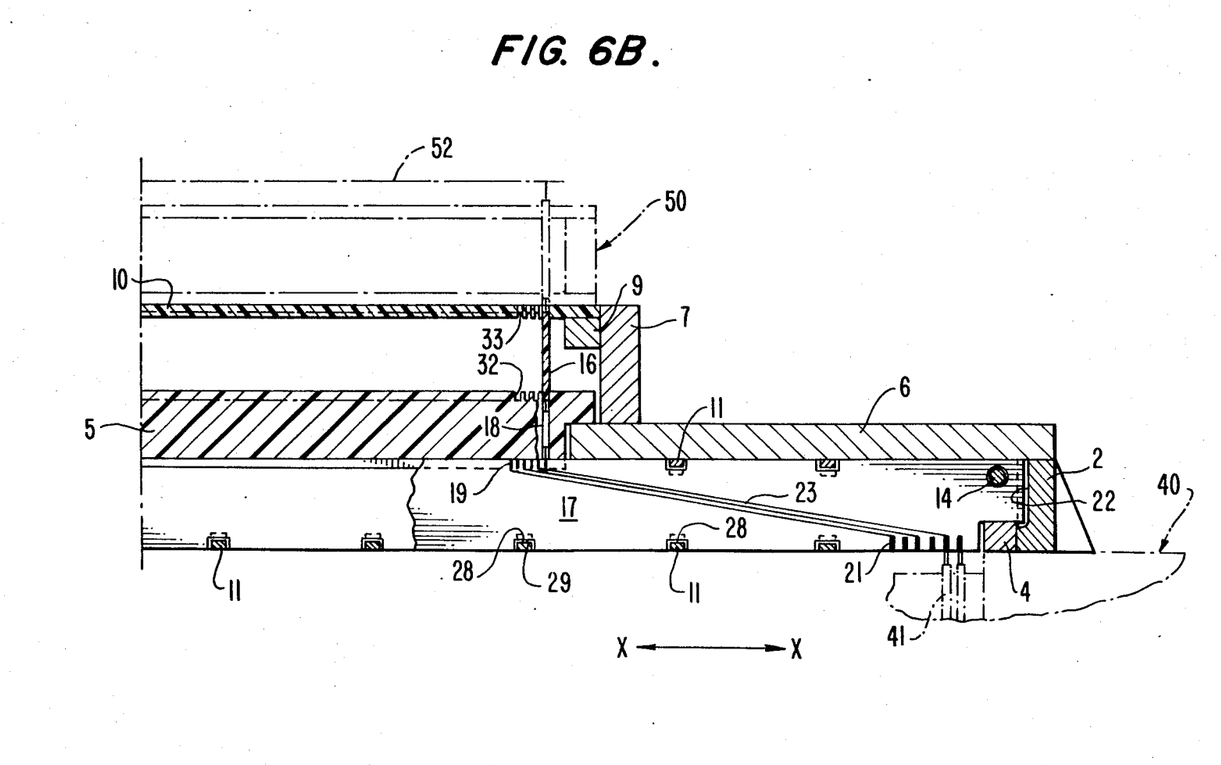

The frame includes pairs of frame side elements 1 and 2. Each side element 2 has an associated side support strip 4 attached thereto. The plurality of cards 17 are disposed up-edge in parallel between side elements 2 and rest on strips 4. Only a few of these reducing cards 17 are shown in FIGS. 5A–6B for the sake of clarity. To the extent the embodiment herein illustrated and described has 256 by 256 contacts, the lower level comprises 256 reducing adaptor cards 17 mounted in parallel with each other in the square frame. As shown in FIGS. 6A and 6B, the individual reducing cards 17 are maintained at the desired 2.54 mm pitch by vertical grooves 22 in side members 2. As reducing cards 17 have to be fairly thin and may have a substantial length, warping or distortion is preferably prevented by providing a plurality of positioning bars 11 extending in a direction transverse to reducing cards 17. Positioning bars 11 are preferably provided with slots 28 therein for receiving that portion of the cards 17 immediately inward of grooves 29 (FIG. 2B), which grooves accommodate the non-slotted portions of the bars 11. While the bars 11 and grooves 29 prevent the utilization of several possible contacts of the grid of the testing apparatus, still every testable point on the printed circuit boards to be tested has an associated test point on the grid of the testing apparatus. Of course, those practicing the instant invention who are desirous of mapping each and every point of the coarse grid to the fine grid and visa versa will appreciate that other techniques can be used to stiffen cards 17 which would not interfere with the coarse grid. However, bars 11 and grooves 29 work quite satisfactorially in the present application which only requires that the mapping be one way, i.e., from the printed circuit board under test to the test apparatus.

Lower cards 17 may be fixed in place within the frame formed by pairs of elements 1 and 2 by means of cover plates 6 which are preferably attached to side elements 2 by means of suitable fastening devices (not shown). Cards 17 may further be fixed in place by means of tie rods 14.

The reducing adaptor cards 17 disposed on the lower level cause the contact array 19 at the top of the lower-level assembly to be reduced only in the X direction. It is unchanged in the Y direction at this point and correspondes approximnately to the boundaries established by upper frame side members 7 and the side members 1 shown in FIG. 4. Preferably, disposed over this rectangular contact array is a correspondingly shaped rectangular epoxy guide plate 5 which has vertical openings for receiving pins 18 aligned with the contacts in the rectangular contact array below. Guide plate 5 may be attached to cover plate 6 and a bracket 3 by means of suitable fastening devices, such as fasteners 34. Brackets 3 may in turn be attached to side elements 1 by means of fasteners 9. Side members 7 may be fixed to cover plate 6 and side elements 1 by means of suitable fastening devices.

Pins 18 telescope axially and establish the desired connections between the lower reducing adaptor cards 17 and the upper reducing adaptor cards 16. As shown in FIGS. 5A, 5B, 6A and 6B, guide plate 5 has, on its bottom surface, grooves 31 extending in the X direction for receiving the top edge of each card 17 and on its top surface grooves 32 extending in the Y direction for receiving a bottom edge of each upper card 16.

The cards 16 comprising the upper array B may be identical to cards 17 or may be fabricated without grooves 29 along the lower edge thereof as these cards are received in grooves 32 in guide plate 5, there may be no necessity to provide additional lateral support by means of positioning bars 11. In any event, cards 16 in addition to being maintained at their desired 1.27 mm pitch by the spacing of grooves 32, are also held in this pitch by grooves 12 in side elements 1A. Side elements 1A are preferably disposed immediately above side elements 1 and are attached thereto by means of fastening devices 8. The upper cards 16 are fixed in place by means of upper cover plates 13 and by tie rods 15.

Preferably, the upper plurality of cards 16 is also held against warpage by means of a grid connecting plate 10 which has a series of grooves 33 therein for receiving the top edges of cards 16. Connecting plate 10 also has openings in an array with a 1.27 mm pitch to receive connectors 51 from the customizable fixture 50 which customizable fixture is the subject of the aforementioned U.S. Patent Application and German Laid Open Publication. Grid connecting plate 10 is preferably attached to blocks 9 by means of suitable fastening devices, which blocks 9 are in turn preferably attached to side elements 7 by means of suitable fastening devices.

As shown in FIGS. 3 and 4, suitable grip elements 20 may be attached to the frame to enable the reducing adaptor to be handled without difficulty.

Those skilled in the art will appreciate that the instant invention can be conveniently used to change contact density from a relatively coarse array to a fine array or, from a relatively fine array to a coarse array. Whether or not there is an exact one to one mapping of the contacts from the coarser array into the finer array and visa versa, is a matter of design choice. In the instant application, it is only necessary that the desired test points on the printed circuit board to be tested map into the test points available on the printed circuit board testing apparatus. Thus, the fact that positioning rods 11 eliminate access to some of the test points available on the testing apparatus is of no consequence provided, of course, that the testing apparatus has a sufficient number of test points to accommodate the desired number of test points on the printed circuit board to be tested. However, since the testing apparatus likely has a test array of the size of 256×256, (providing a total of 65,536 contacts), it is usually of no consequence that access may not be had to several thousand of those contacts by reason of positioning bars 11 in view of the fact that there are still more than some 60,000 possible contact test points available on the testing apparatus which should far exceed the number of desired test points on any printed circuit board. In any event, as previously mentioned, other means than positioning rods 11 may be used to stiffen lower cards 17 which means could well embrace a connecting plate such as plate 10 used with respect to the upper set of cards 16.

Having described the invention with respect to a particular preferred embodiment thereof, various modifications thereof will be apparent to those skilled in the art. Therefore, the invention is not to be limited to the specific embodiments disclosed except as required by the appended claims.

We claim:

1. An apparatus for changing the contact pitch of a contact array from a first density to a contact array of a second density in order to electrically interconnect a pair of electrical circuit devices having contact arrays corresponding to the first and second densities, said apparatus comprising:

a first plurality of cards arranged in parallel with each other, each said card having two opposite parallel longitunal edges, each card having thereon a row of contacts of which the mutual spacing on one longitudinal edge corresponds to the pitch of one of said arrays and the mutual spacing on the other longitudinal edge corresponds to the pitch of the other one of said arrays, with the associated contacts along the two longitudinal edges being connected by conductors extending across said cards;

a second plurality of cards arranged in parallel with each other, each said card of the second plurality having two opposite parallel longitudnal edges, each card of the second plurality having thereon a row of contacts of which the mutual spacing on one longitudinal edge corresponds to the pitch of one of said arrays and the mutual spacing on the other longitudinal edge corresponds to the pitch of the other one of said arrays, with the associated contacts along the two longitudinal edges being connected by conductors extending across said cards;

said cards of said second plurality being disposed facing said first plurality of cards and at an angle to said first plurality; and means electrically interconnecting contacts of the first plurality of cards to associated contacts of the second plurality of cards.

2. The apparatus as claimed in claim 1, wherein said interconnecting means comprises telescoping resilient contact pins held by a guide plate.

3. The apparatus as claimed in claim 2, wherein said guide plate has bottom and top surfaces thereof facing the two facing pluralities of cards and includes grooves in said bottom and top surfaces extending in directions parallel to said first and second pluralities of cards to receive and guide respective longitudinal edges of the respective cards.

4. The apparatus as claimed in claim 3, further including a contact array connecting plate having grooves therein for receiving and holding longitudinal edges of said cards one of said pluralities of cards, said contact array connecting plate further having bores therethrough aligned with the contacts of said one of said pluralities.

5. The apparatus as claimed in claim 3, further including positioning bars extending at right angles to at least one of said pluralities of cards for securing those cards against warping.

6. An apparatus for changing the contact pitch of a contact array from a first density to a contact array of a second density in order to electrically interconnect a pair of electrical circuit devices having contact arrays corresponding to the first and second densities, said apparatus comprising:
   a first plurality of cards arranged essentially parallel with one another, each of said cards having two opposite parallel and elongated edges, each card further having thereon a first two of contacts disposed along one of its elongated edges, the mutual spacing of said first row of contacts corresponding to the pitch of the first density contact array, each said card having thereon a second row of contacts disposed along the other elongated edge, the mutual spacing of said second row of contacts corresponding to the pitch of the second density array, said cards further including conductors disposed thereon extending across the cards to connect the contacts of said first row with respective contacts of said second row;
   a second plurality of cards having the same structural and electrical features as does said first plurality of cards, said second plurality of cards also arranged essentially parallel with each other but at generally a right angle orientation to said first plurality of cards and disposed such that the contacts in said second rows of contacts of said first plurality of cards align with said contacts of said first rows of contacts of said second plurality of cards; and
   means electrically interconnecting said second rows of contacts of said first plurality of cards with said first rows of contacts of said second plurality of cards.

7. The apparatus as claimed in claim 6, wherein said first plurality of cards is arranged with a mutual spacing between the cards thereof which corresponds to the pitch of the first density contact array while the second plurality of cards is arranged with a mutual spacing between the cards thereof which corresponds to the pitch of the second density contact array.

8. The apparatus as claimed in claim 7, wherein said first density contact array is a coarser array than said second density contact array.

9. The apparatus as claimed in claim 8, wherein said cards are planar printed circuit boards and wherein the contacts and conductors formed thereon are provided by printed circuit patterns disposed on said boards.

10. The apparatus as claimed in claim 8, wherein said interconnecting means comprises a plurality of telescoping resilient contact pins which are disposed between the contacts in said second rows of said first plurality of cards and the contacts in said first rows of said second plurality of cards.

11. The apparatus as claimed in claim 10, further including a guide plate disposed between said first and second pluralities of cards, said guide plate having apertures therein for receiving said plurality of pins.

12. The apparatus as claimed in claim 11, wherein said guide plate includes means for retaining said pluralities of cards in their respective parallel arrangements.

13. The apparatus as claimed in claim 12, wherein said guide plate includes first and second major surfaces and wherein said retaining means comprises pluralities of parallelly disposed channels on said surfaces for receiving edges of said cards of respective said pluralities of cards.

14. The apparatus as claimed in claim 13, wherein said apertures extend between said first and second major surfaces and only intersect said channels in said first and second major surfaces.

15. The apparatus as claimed in claim 6, further including means for fixing said first plurality of cards in a series of parallel planes which have a mutual spacing therebetween equal to the pitch of the first density contact array and for fixing said second plurality of cards in a series of planes having a mutual spacing therebetween equal to the pitch of the second density contact array.

16. The apparatus as claimed in claim 6, further including a guide plate disposed between said first and second pluralities of cards, said first and second pluralities of cards being arranged mutually orthogonal to said guide plate.

17. An apparatus having a first array of electrical contacts of a relatively coarse pitch and a second array of contacts of a relatively fine pitch, said apparatus comprising:
   a first plurality of elongated cards arranged essentially parallel with one another, each of said cards having a row of contacts disposed thereon having a mutual spacing equal to said coarse pitch;
   a second plurality of elongated cards arranged essentially parallel with one another, each one of said cards of said second plurality having a series of contacts thereon having a mutual spacing equal to said fine pitch; and
   means interconnecting said coarse pitch contacts of said first plurality of cards with said fine pitch contacts of said second plurality of cards.

18. The apparatus as claimed in claim 17, wherein said connecting means comprises on each of said cards of said first plurality an additional row of contacts having a mutual spacing equal to said fine pitch and on said second plurality of cards an additional row of contacts having a mutual spacing equal to said coarse pitch, and means on both said first plurality and second plurality of cards interconnecting respective ones of the first-mentioned contacts with the additional contacts.

19. The apparatus as claimed in claim 18, wherein said connecting means further includes a plurality of pins ohmically contacting ones of said additional contacts of said first plurality of cards with ones of said additional contacts of said second plurality of cards.

* * * * *